United States Patent
Kamijima

[11] Patent Number: 5,932,396
[45] Date of Patent: Aug. 3, 1999

[54] METHOD FOR FORMING MAGNETIC POLES IN THIN FILM MAGNETIC HEADS

[75] Inventor: Akifumi Kamijima, Tokyo, Japan

[73] Assignee: TDK Corporation, Tokyo, Japan

[21] Appl. No.: 08/941,038

[22] Filed: Sep. 30, 1997

[30] Foreign Application Priority Data

Oct. 18, 1996 [JP] Japan ................................. 8-297437
Jan. 23, 1997 [JP] Japan ................................. 9-024229

[51] Int. Cl.$^6$ ........................................... G03C 5/00
[52] U.S. Cl. ..................... 430/320; 430/190; 430/192; 430/325; 29/603.07
[58] Field of Search .................... 430/190, 311, 430/320, 325; 29/603.07

[56] References Cited

U.S. PATENT DOCUMENTS

| | | | |
|---|---|---|---|
| 3,853,715 | 12/1974 | Romankiw | 204/15 |
| 4,614,563 | 9/1986 | Kubo | 156/643 |
| 5,068,959 | 12/1991 | Sidman | 29/603 |
| 5,422,221 | 6/1995 | Okazaki et al. | 430/190 |
| 5,725,997 | 3/1998 | Kamijima | 430/325 |

FOREIGN PATENT DOCUMENTS 56-36706  8/1981  Japan.
6-242602  9/1994  Japan.

*Primary Examiner*—John S. Chu
*Attorney, Agent, or Firm*—Oblon, Spivak, McClelland, Maier & Neustadt, P.C.

[57] ABSTRACT

A resist composition is used to form a plating frame including a space having a section of up to 2 μm in width and at least 4 μm in depth. The resist composition contains as an alkali-soluble resin and a sensitizer a novolak resin obtained by substituting a hydrogen atom in a hydroxyl group in a novolak resin comprising at least one recurring unit represented by the following formula (1):

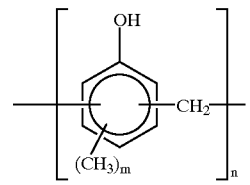

wherein n is an integer of 1 to 4 and m is an integer of 0 to 3, and having a weight average molecular weight of 2,000 to 6,000 calculated as polystyrene by 0.12 to 0.22 moles per hydrogen atom of a 1,2-naphthoquinonediazidosulfonyl group.

10 Claims, 5 Drawing Sheets

1 μm

1 μm

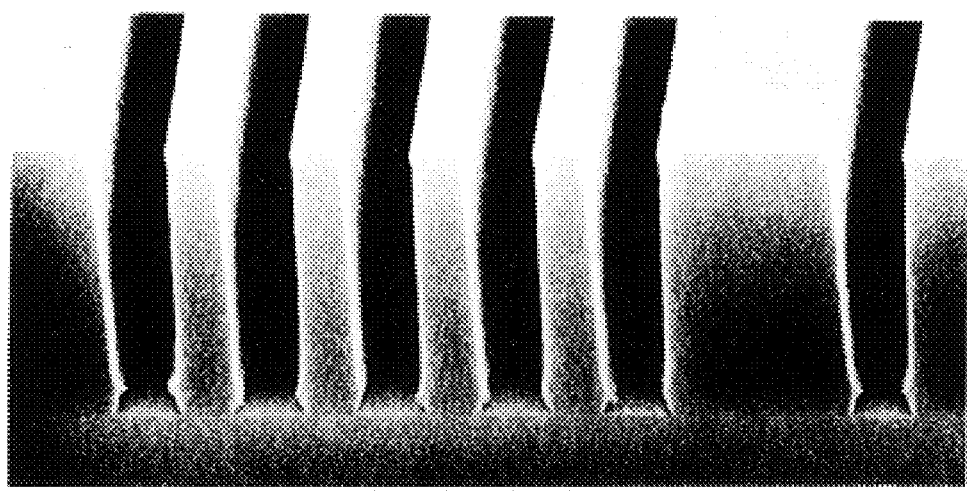
FIG.6  1μm
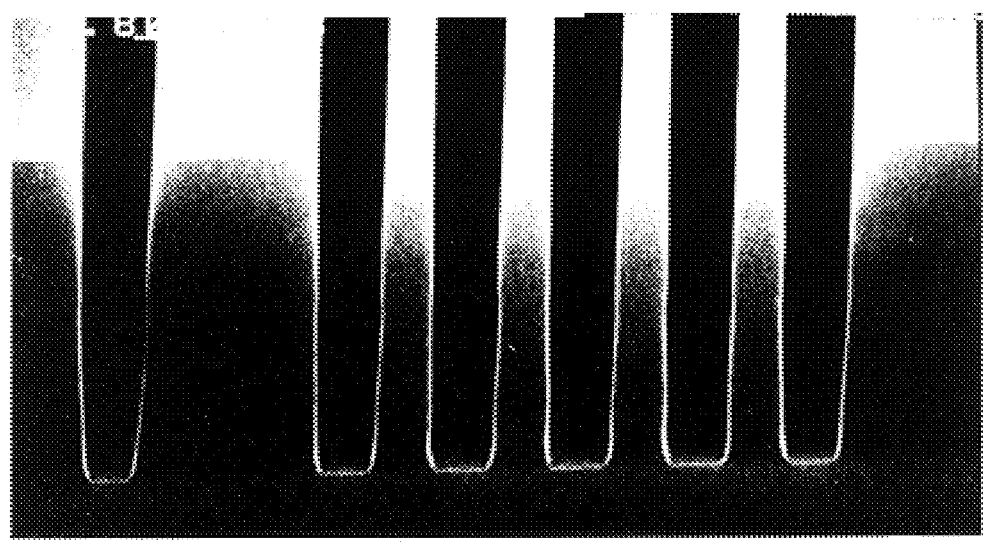
FIG.7  1μm

METHOD FOR FORMING MAGNETIC POLES IN THIN FILM MAGNETIC HEADS

BACKGROUND OF THE INVENTION

The present invention relates to a method for forming magnetic poles in thin film magnetic heads by a frame plating technique.

In recent years, magnetic recording has been performed at much higher densities. With this, thin film magnetic heads using soft magnetic thin films for magnetic poles, and magnetoresistance (MR) heads making use of magnetoresistance effect for reproducing purposes have been under remarkable developments. An MR head is designed to read external magnetic signals through a resistance change in a reading sensor formed of magnetic material. A characteristic feature of the MR head is that high outputs are achievable even when magnetic recording is performed at high linear densities because outputs are not dependent on its relative speed with respect to a recording medium. For the MR head that is a reproducing head, an MR induction composite head is used, in which an MR head portion is provided in the form of an integral piece of an induction head portion for recording purposes.

A thin film magnetic head is typically fabricated by stacking on an insulating substrate a lower magnetic pole, a gap layer, a coil surrounded by an insulating film, an upper pole and a protective film in the described order. Magnetic pole formation is usually achieved by a so-called frame plating technique. For instance, the frame plating technique is described in JP-B 56-36706. The frame plating technique is used to form members having limited dimensional tolerances such as magnetic poles in thin film magnetic heads. According to the frame plating technique, the article to be plated is first provided with a plating frame. To form magnetic poles, the plating frame is formed by the patterning of a resist film in such a manner that a space (hole) commensurate with magnetic pole shape is left.

In recently developed magnetic heads, the widths of the tip portions of magnet poles are very narrow as typically expressed by 2 $\mu$m or lower to be compatible with recording track width decreases incidental to recording density increases, and so much severer conditions are imposed on the dimensional accuracy demanded. On the other hand, the thickness of an upper magnetic pole (the length of the magnetic pole), for instance, should be 3 $\mu$m or lower. A plating film formed in the form of an upper magnetic pole during the fabrication of a thin film magnetic head decreases in thickness under the influences of etching or other operations in the subsequent steps. A plating frame for forming the tip portions of magnetic poles should also be thicker than required because the resist film used is poor in the capability of tracing thickness (hereinafter called the thickness traceability), as will be described later. For these reasons, the plating film must have a thickness of at least 4 $\mu$m so as to form an upper magnetic pole of at least 3 $\mu$m in thickness. Correspondingly, it is required for the plating frame to have a height of at least 4 $\mu$m. When magnetic poles for such narrow tracks are formed, therefore, it is required to form in a resist film a narrow yet relatively deep space with a depth to width ratio of at least 2.

A general positive resist has so far been used for plating frame material. It is understood that the term "general positive resist" used herein refers to a mixture of an alkali-soluble phenol resin and a sensitizer (e.g., naphthoquinonediazide). When used to form magnetic poles in a thin film magnetic head, the positive resist for the plating frame should have three major properties:

1) it should have high resolution;
2) upon coated on a step, it should provide a film unlikely to vary in thickness between on the step and the vicinity of a gap adjacent to a lower portion of the step (or it should be excellent in the thickness traceability); and
3) it is well resistant to plating (chemicals, compression, and heat). A conventional positive resist is unsuitable for the formation of magnetic poles for narrow tracks which are required to have high dimensional accuracy, as explained below. This is because the conventional positive resist is found to be insufficient in terms of properties 1) and 2).

When magnetic poles for narrow tracks are formed, it is required to form a plating frame having a narrow yet relatively deep space, as mentioned above. When a conventional positive resist is used to form a narrow yet relatively deep space in a resist film, however, a bottom portion of the space has a shape defected called tailling, as can be seen from FIG. 5, due to insufficient resolution. Such disorders in the sectional shape of the space make the width of the space inconsistent in the depth-wise direction.

Poor thickness traceability poses such problems as mentioned below. As depicted in FIG. 2 A, an upper magnetic pole in a thin film magnetic head is formed on an insulating film 23 including a coil 24 therein with an electroconductive seed film 3 located between them. In the vicinity of the coil 24, there is a step of about 10 $\mu$m in height with respect to the vicinity of a gap (a left-handed portion of an insulating film 22 shown). For this reason, a plating frame for forming the upper magnetic pole is formed astride the step. A resist film 41 that provides the plating frame is usually formed by spin coating. When the resist is poor in the thickness traceability, however, it cannot faithfully trace the step. This in turn causes the resist film 41 to become too thick in the vicinity of the gap adjacent to a lower portion of the step, as depicted in FIG. 2 B. When the resist film becomes too thick, it is difficult to form a space of good dimensional accuracy upon patterning. A portion of the plating frame in the vicinity of the gap adjacent to the lower portion of the step is provided to form the tip of the magnetic pole. When the dimensional accuracy of a space in that frame portion is worse, a problem arises upon the formation of a magnetic pole for narrow tracks. This may be avoided under forming conditions preset in such a manner that the thickness of the resist film is optimized in the vicinity of the gap adjacent to the lower portion of the step. In this case, the thickness of the resist film 41 on the step becomes too thin, as depicted in FIG. 2 C, resulting in a (overhanging) phenomenon in which a yoke portion of the magnetic pole formed on the step goes over the plating frame. In this case, the volume of the yoke portion of the magnetic pole becomes variable because it is substantially impossible to place the amount of overhanging under control. For this reason, it is difficult to fabricate magnetic heads having consistent properties.

It is therefore an object of the present invention to make it possible to form a plating frame having a narrow yet relatively deep space of good dimensional accuracy when a magnetic pole in a thin film magnetic head is formed by a frame plating technique.

SUMMARY OF THE INVENTION

Such an object is achieved by the present invention defined below as (1) and (2).

(1) A method for fabricating a magnetic pole in a thin film magnetic head by a frame plating technique, wherein: a resist composition is used to form a plating frame including a space having a section of up to 2 $\mu$m in width and at least 4 μm in depth, said resist composition containing as an alkali-soluble resin and a sensitizer a novolak resin obtained by substituting a hydrogen atom in a hydroxyl group in a novolak resin comprising at least one recurring unit represented by the following formula (1):

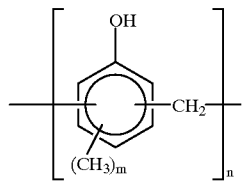

wherein n is an integer of 1 to 4 and m is an integer of 0 to 3, and having a weight average molecular weight of 2,000 to 6,000 calculated as polystyrene by 0.12 to 0.22 moles per hydrogen atom of a 1,2-naphthoquinonediazidosulfonyl group.

(2) The fabrication method of the above (1), wherein said space has a sectional depth of up to 10 μm.

BRIEF DESCRIPTION OF THE DRAWINGS

By way of illustration alone but not by way of limitation, preferred embodiments of the present invention will now be explained with reference to the accompanying drawings.

FIG. 2 A is a sectional schematic of the upper magnetic pole fabricated using the resist composition according to the present invention, and FIGS. 2 B and 2 C are sectional schematics of the upper magnetic poles fabricated using conventional resist compositions.

FIG. 4 is a scanning electron microphotograph taken of one plating frame formed according to the present invention.

FIG. 5 is a scanning electron microphotograph taken of one plating frame formed using a resist composition departing from the range defined herein.

FIG. 6 is a substitute photograph for a drawing showing a fine pattern formed on a substrate. That is, FIG. 6 is a scanning electron microphotograph taken of another plating frame formed using a resist composition departing from the range defined herein.

FIG. 7 is a substitute photograph for a drawing showing a fine pattern formed on a substrate. That is, FIG. 7 is a scanning electron microphotograph taken of another plating frame formed according to the present invention.

DETAILED EXPLANATION OF THE PREFERRED EMBODIMENTS

Figure 1:
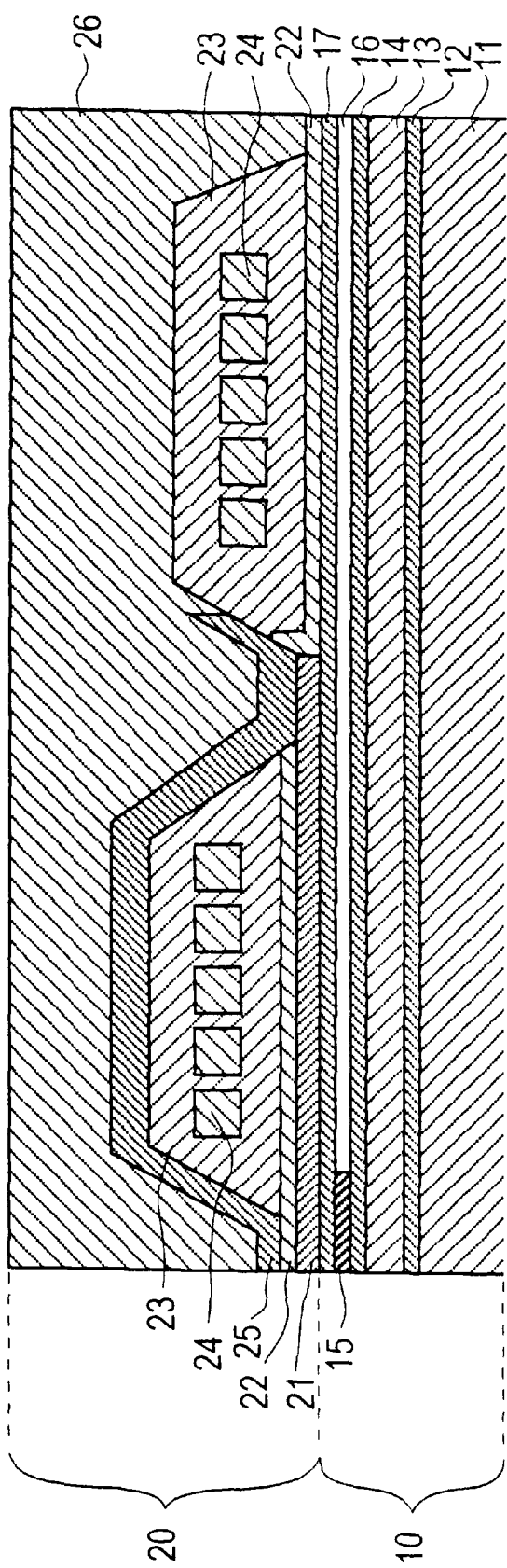
FIG. 1 is a sectional schematic illustrative of one exemplary construction of an MR induction composite head.

In the practice of the present invention, the aforesaid specific resist composition is used with the frame plating technique for forming magnetic poles for narrow tracks in a thin film magnetic head.

This resist composition can provide a uniform resist film because of being a one-component system containing the substituted novolak resin that acts as not only a positive resist but also a sensitizer.

In this substituted novolak resin, the weight-average molecular weight—calculated as polystyrene—of the novolak resin to be substituted and the degree of substitution of 1,2-naphthoquinonediazidosulfonyl groups lie within the ranges defined herein. It is thus possible to form with high dimensional accuracy a narrow yet relatively deep space which is free from shape defects such as tailling or necking in the vicinity of its bottom. It is also possible to form a resist film excellent in the thickness traceability and hence a space of good dimensional accuracy. The resist composition of the present invention is excellent in sensitivity as well.

JP-A 6-242602 discloses a resist composition containing a novolak resin obtained by substituting hydrogen atoms in hydroxyl groups in a novolak resin having a weight-average molecular weight of 1,000 to 10,000 when calculated as polystyrene by 0.03 to 0.27 moles per hydrogen atom of 1,2-naphthoquinonediazidosulfonyl groups. The weight-average molecular weight and degree of substitution of the novolak resin used in the present invention come within the ranges set forth in the publication. However, the publication refers merely to the effect of the one-component base resist composition itself. Thus, the publication fails to provide disclosures of what the resist composition is specifically used for and what effect is obtained when the resist composition is used in a specific application. The resist composition according to the present invention is optimized for the production of a plating frame used to form magnetic poles in a magnetic head by selecting a specific range of weight-average molecular weight and a specific range of the degree of substitution with respect to the resist composition set forth in the publication. In the present invention, the aforesaid weight-average molecular weight and the aforesaid degree of substitution are selected to form a plating frame including spaces having a width of up to 2 μm and a depth of at least 4 μm. It is impossible to achieve spaces whose section is free from shape defects such as tailling and necking without limiting both the weight-average molecular weight and the degree of substitution to the aforesaid specific ranges.

JP-A 6-242602 also provides an example teaching the weight-average molecular weight and degree of substitution coming within the ranges defined in the present invention. Novolak materials B to G shown in Table 1 have their weight-average molecular weight Mw coming within the range defined in the present invention. Of these novolak materials, products B' to F' shown in Table 2 (solids B' to F' shown in Table 3) have their degree of substitution falling within the range defined in the present invention. As can be understood from Table 3, however, the thickness of resist films formed using composition solutions containing solids B' to F' is 0.8 to 3 μm. Accordingly, spaces formed in such resist films, too, have a depth of 0.8 to 3 μm that is below the lower limit of the range defined in the present invention. In a certain example of JP-A 6-242602, there is a description to the effect that, by definition, $E_{OP}$ represents a place where, given 5 μm L/S, the dimensional ratio of the line & space at the bottom position is 1:1 at the optimum focal position. In this description, L/S means line/space. Accordingly, the width of a space formed in the resist film in that example is 5 μm that exceeds the upper limit of the range defined in the present invention. A space having a depth of up to 3 μm at a width of 5 μm takes a relatively shallow shape as expressed by a depth to width ratio of up to 0.6. However, the space according to the present invention has a width of up to 2 μm and a depth of at least 4 μm or a depth to width ratio of at least 2, and so takes a relatively deep shape. When such a space having a relatively large depth is formed, shape defects such as tailling or necking are likely to occur in section. With the resist composition according to the present invention, however, it is possible to prevent the occurrence of shape defects such as tailling or necking when a space having a relatively deep shape is formed.

Resist Composition

The resist composition used herein contains a novolak resin wherein hydrogen atoms in hydroxyl groups in a novolak resin comprising at least one recurring unit represented by formula (1) are substituted by 1,2-naphthoquinonediazidosulfonyl groups. The novolak resin with 1,2-naphthoquinonediazidosulfonyl groups introduced therein acts as an alkali-soluble resin and a sensitizer as well.

The novolak resin comprising at least one recurring unit represented by formula (1) should have a weight-average molecular weight of 2,000 to 6,000 and preferably 4,000 to 5,000 as calculated in the form of polystyrene. When the weight-average molecular weight is too low, necking is likely to occur in the bottom portion of a space in the plating frame. When it is too high, on the contrary, tailling is likely to occur in the bottom portion of a space in the plating frame due to insufficient resolution. In either case, it is impossible to form a space of excellent dimensional accuracy. It is noted that by the term "space in the plating frame" is intended a space having a unique section of up to 2 μm, especially up to 1.5 μm in width and at least 4 μm in depth. Preferably in this case, the space has a depth of usually up to 10 μm, and especially up to 8 μm. It is unnecessary to use a space having a depth exceeding 10 μm for the formation of magnetic poles. The present invention is less effective for too deep a space, because tailling is likely to occur in a bottom surface portion of such a space.

The degree of substitution or esterification of the 1,2-naphthoquinonediazidosulfonyl group is 0.12 to 0.22 moles and preferably 0.16 to 0.18 moles per hydrogen atom. Regarding a conventional positive resist that is a mixture of novolak resin and a sensitizer naphthoquinonediazide, it is said that an unexposed portion of the sensitizer undergoes azo-coupling on the surface of the resist upon development. In the one-component positive resist used in the present invention, the novolak resin combines together upon the aforesaid azo-coupling reaction to give rise to an increase in molecular weight, because the sensitizer forms part of the novolak resin. With an increase in the aforesaid degree of substitution in the one-component positive resist, the number of points of binding (crosslinking) increases, so that the molecular weight increase becomes more noticeable upon the azo-coupling reaction, and the binding mechanism becomes more complicated. Thus, the higher the aforesaid degree of substitution, the higher the plating resistance properties such as heat resistance and compression resistance. At too high a degree of substitution, however, the resist composition provides a resist film that is of low sensitivity or absorbs much of exposure light during patterning. In addition, it is impossible to form the aforesaid space having a unique section without tailling or necking. At too low a degree of substitution, on the other hand, the resist composition becomes insufficient in terms of plating resistance.

In the practice of the present invention, the novolak resin having a relatively low weight-average molecular weight when calculated as polystyrene is used. Nonetheless, it is possible to form a resist film of excellent heat resistance without any additional step of cutting off a low-molecular-weight component. This appears to be because when the novolak resin is partially esterified by the direct use of 1,2-naphthoquinonediazidosulfonic acid, the low-molecular-weight component of the novolak resin is preferentially esterified into a sensitizer. It is thus believed that with the one-component resist composition according to the present invention it is possible to obtain heat resistance equivalent to or higher than that achieved by the mixing of a sensitizer with a novolak resin with a low-molecular-weight component cut off.

The resist composition of the present invention has a low average molecular weight before exposed to light because the sensitizer forms part of the novolak resin. It is thus possible to achieve high resolution upon exposure. Upon development, this resist composition can have a high molecular weight due to crosslinking reactions such as azo-coupling reaction, and so can provide a plating frame of very high heat resistance. Thus, the present invention enables high resolution upon exposure and heat resistance upon development to be achieved at the same time.

The resist composition according to the present invention may be used with exposure light of varying wavelengths because the nucleus of the sensitizer is made up of the novolak resin itself. In other words, it is unnecessary to change the sensitizer even when the wavelength of exposure light is changed.

The resist composition according to the present invention is of consistent quality stability because it is a one-component resist composition wherein the sensitizer forms part of the novolak resin that is a structural component of the resist film. In other words, the quality stability of this resist composition is not affected by variations in the blend ratio of the novolak resin and sensitizer during preparation.

Preparation of Resist Composition

The novolak resin of formula (1) may be obtained by conventional polycondensation of phenols and aldehydes.

Preferable for the phenols used herein are m-cresol, p-cresol or their mixture. However, the present invention is not limited to them, and so use may be made of phenol, xylenol isomers, trimethylphenol isomers or their mixtures.

Preferable for the aldehydes polycondensed with these phenols is formaldehyde. However, the present invention is not limited to it, and so use may be made of aldehydes having up to 4 carbon atoms, e.g., acetaldehyde, propylaldehyde and butylaldehyde, or their mixture. The amount of the aldehydes used may optionally be determined depending on the desired weight-average molecular weight of the end novolak resin. In the practice of the present invention, however, it is usually preferable to use the aldehydes in an amount of 0.3 to 1.5 moles per mole of the phenols.

The catalyst used for the aforesaid polycondensation is an acidic catalyst as preferably exemplified by oxalic acid, acetic acid, and formic acid. However, hydrochloric acid, nitric acid, and sulfuric acid may be used as well. While a hydrophilic solvent such as methanol or dioxane is used for a reaction solvent, it is preferable to carry out polycondensation at a temperature of 50 to 150° C. After the completion of the polycondensation, it is preferable to remove unreacted materials with the catalyst by stripping the reaction product under reduced pressure at 130 to 250° C., or washing the reaction product with water, and extracting it in a solvent such as ECA (ethyl cellosolve acetate), followed by stripping under reduced pressure at 130 to 250° C. In this way, the novolak resin according to the present invention is obtained.

In the thus synthesized novolak resin, a part of hydrogen atoms in the hydroxyl groups is substituted by 1,2-naphthoquinonediazidosulfonyl groups. The 1,2-quinonediazide compound used for the introduction of such groups, for instance, include 1,2-naphthoquinonediazido-4-sulfonic acid ester, and 1,2-naphthoquinonediazido-5-sulfonic acid ester. Partial esterification by the 1,2-quinonediazide compound may be carried out according to ordinary manners.

The resist composition according to the present invention may further contain various additives such as dyes, pigments and surface active agents optionally with other sensitizers. The surfactant used, for instance, may be commercial products Furolard FC-430 and FC-431 (made by Sumitomo 3M). The amount of such a surfactant used is preferably up to 2 parts by weight per 100 parts by weight of the novolak resin with 1,2-naphthoquinonediazidosulfonyl groups introduced in it.

In the practice of the present invention, the resist composition is prepared by dissolving the novolak resin with 1,2-naphthoquinonediazidosulfonyl groups introduced therein in a solvent and, if necessary, adding various additives to the solution. The resist composition contains the aforesaid novolak resin preferably at a concentration of about 15 to about 60% by weight. Most generally, it is preferable to use ECA (ethyl cellosolve acetate) for the aforesaid solvent. However, it is also possible to use for that solvent ethylene glycol monomethyl ether, ethylene glycol monoethyl ether, methyl cellosolve acetate, diethylene glycol monomethyl ether, diethylene glycol monoethyl ether, propylene glycol methyl ether acetate, propylene glycol propyl ether acetate, ethyl lactate, methyl ethyl ketone, cyclohexane, ethyl 2-dihydroxypropionate, ethyl 2-hydroxy-2-methylpropionate, and EL-BA (ethyl lactate/n-butyl acetate).

Construction of Thin Film Magnetic Head

The present invention is applied to the formation of magnetic poles in ordinary induction thin film magnetic heads and MR induction composite heads. An MR induction composite head comprises a reproducing MR (magnetoresistance) head portion and a recording induction head portion. A typical construction of the MR induction composite head is explained as an example of the induction thin film magnetic head.

One embodiment of the MR induction composite head is illustrated in FIG. 1. This composite head has a stack structure wherein an induction head portion 20 is integrally stacked on an MR head portion 10. In the MR head portion 10, an insulating film 12, a lower shielding film 13, an insulating film 14, an MR (magnetoresistance) film 15, an MR lead film (electrode film for the MR film) 16 and an insulating film 17 are stacked on a substrate 11 in the described order. The induction head portion 20 has a stack structure comprising a lower magnetic pole 21, an insulating film 22, an insulating film 23, a coil 24, an upper magnetic pole 25 and a protective film 26 in the described order, with the insulating films 22 and 23 functioning as gaps between the magnetic poles.

Ceramics materials such as AlTiC are usually used for the substrate 11.

Preferably, the insulating film 12 has a thickness of about 1 to about 20 μm and is formed of $Al_2O_3$, $SiO_2$ or the like by suitable means such as sputtering.

Preferably, the lower shielding film 13 has a thickness of about 0.1 to about 5 μm and is formed of FeAlSi, NiFe, CoFe, CoFeNi, FeN, FeZrN, FeTaN, CoZrNb, CoZrTa or the like by suitable means such as sputtering or plating.

Preferably, the insulating film 14 has a thickness of about 100 to 2,000 Å and is formed of $Al_2O_3$, $SiO_2$ or the like by suitable means such as sputtering.

The MR film 15 may be formed of one single magnetic layer. However, it is usually preferable to use for this film a multilayer structure comprising a magnetic layer and a non-magnetic layer. For instance, it is preferred that the magnetic layer be formed of NiFe, NiFeRh, FeMn, NiMn, Co, Fe, NiO or NiFeCr while the non-magnetic layer is formed of Ta, Cu or Ag. For the aforesaid multilayer structure, it is preferable to use a three-layer structure such as NiFeRh/Ta/NiFe, and a multilayer structure comprising units, each containing plural layers such as NiFe/Cu/NiFe/FeMn, NiFe/Cu/Co/FeMn, Cu/Co/Cu/NiFe, Fe/Cr, Co/Cu, and Co/Ag. Preferably in this case, the magnetic layer has a thickness of 5 to 500 Å, especially 10 to 250 Å and the non-magnetic layer has a thickness of 5 to 500 Å, especially 10 to 250 Å. Preferably, the number of repeated structural units is 1 to 30, and especially 1 to 20. Preferably, the overall thickness of the MR film is 50 to 1,000 Å, and especially 100 to 600 Å. Preferably, the MR film is formed by suitable means such as sputtering, and plating.

Preferably, the MR lead film 16 has a thickness of 100 to 5,000 Å, especially about 500 to about 3,000 Å and is formed of W, Cu, Au, Ag, Ta, Mo, CoPt or the like by suitable means such as sputtering or plating.

Preferably, the insulating film 17 has a thickness of 50 to 5,000 Å, especially 100 to 2,000 Å and is formed of $Al_2O_3$, $SiO_2$ or the like by suitable means such as sputtering.

Each of the films forming the MR head portion may be patterned by an ordinary lift-off technique using a resist pattern and/or a milling patterning technique.

The lower and upper magnet poles 21 and 25 in the induction head portion 20 are each constructed of soft magnetic material such as NiFe, CoFe, and CoFeNi. The lower magnetic pole is of about 0.5 to about 4 μm in thickness, and the upper magnetic pole is of about 3 to about 5 μm in thickness. In the embodiment shown, the lower magnetic pole 21 also acts as a magnetic shielding film for the MR film, and so is wider than the upper magnetic pole 25. The lower magnetic pole may be formed by suitable means such as plating, and sputtering. In the practice of the present invention, however, the upper magnetic should be formed by the frame plating technique It is noted that each magnetic pole is constructed of a tip portion on a side opposite to a medium (the left side of the composite head shown) and a wide yoke portion contiguous thereto. It is also noted that the tip and yoke portions are usually formed with an integral form of plating frame. However, these portions may be separately made with separate plating frames. When such separate plating frames are used, at least the plating frame for forming the tip portion of the magnetic pole should be formed in accordance with the present invention.

It is preferable that the insulating film 22 has a thickness of about 0.01 to about 0.5 μm, the insulating film 23 has a thickness of about 3 to about 20 μm, and the protective film 26 has a thickness of about 5 to about 50 μm. It is noted that the thickness of the insulating film 23 is equal to the height of a step over which the upper magnetic pole 25 strides. Preferably, the insulating film 22 and protective film 26 are formed of $Al_2O_3$, $SiO_2$ or the like by suitable means such as sputtering. Preferably, the insulating film 23 is formed by heat curing photoresist material.

The coil 24 is constructed of electroconductive material such as Cu. Preferably, the coil has a thickness of about 2 to about 5 μm and is formed by the frame plating technique.

Formation of Magnetic Pole by the Frame Plating Technique

How to form the magnetic pole by the frame plating technique is explained with reference to the formation of the upper magnetic pole 25 shown in FIG. 1, for instance.

Figure 2A:
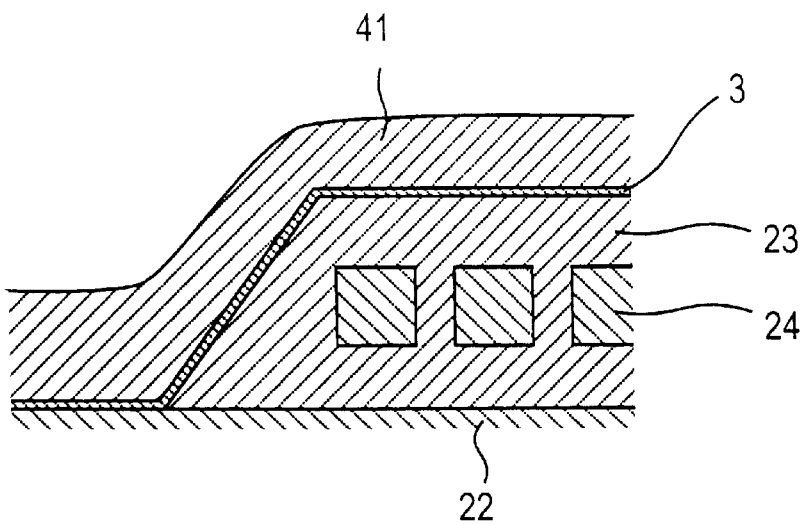
FIG. 2 illustrates the states of upper magnetic poles after a resist film 45 has been formed in the process of fabricating magnetic poles in a thin film magnetic head by the frame plating technique.
Figure 2B:
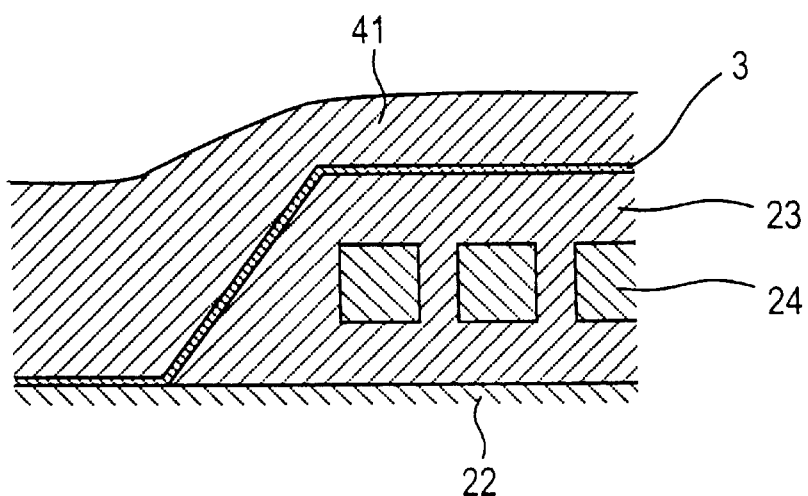
Figure 2C:
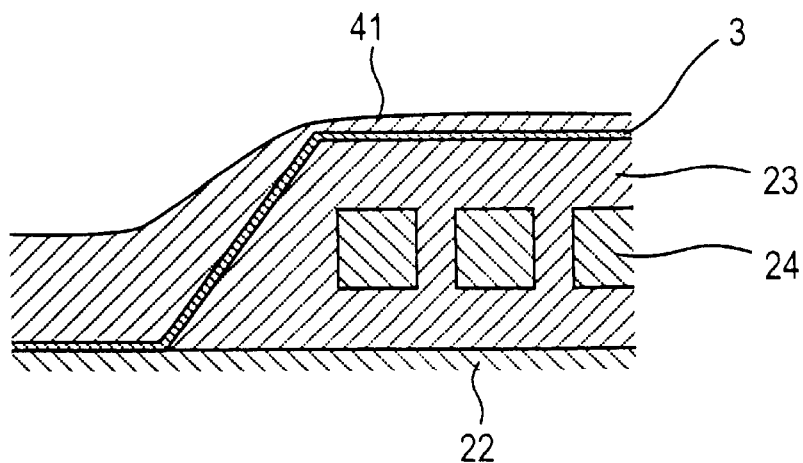

As depicted in FIG. 2 A, a seed film 3 is formed on the coil 24—surrounding insulating film 23 which has already been formed. The seed film acts as an electroconductive undercoat for electroplating. The seed film may be constructed of NiFe, CoFe, CoFeNi or the like. However, it is preferable to construct the seed film of the same material of which the magnetic pole is formed. The seed film may be formed by suitable means such as sputtering, and evaporation. The shielding film has a thickness of about 0.01 to about 0.1 µm.

Then, a resist film 41 is formed on the seed film 3 using the aforesaid resist composition. For this purpose, the resist composition is first coated by spin coating or spray coating. For spray coating, for instance, it is preferable to make use of an electrostatic spray technique as set forth in JP-A 3-215931. Then, prebaking is carried out for drying. This prebaking may be carried out at about 80 to about 120° C. for about 30 to about 300 seconds. Upon prebaked, the resist film 41 has a thickness of 4 to 10 µm and preferably 4 to 8 µm as measured in the vicinity of the gap in the head, i.e., at a position of the seed film 3 in contact with the insulating film 22.

The resist composition according to the present invention, because of being excellent in the thickness traceability as mentioned above, enables the thickness of the resist film 41 on the insulating film 23 to be about 30 to about 50% of that in the vicinity of the gap. Thus, the resist film 41 on the insulating film 23 is thick enough to prevent the yoke portion of the magnetic pole from overhanging the plating frame. Referring here to a conventional resist composition, especially a two-component resist composition wherein a novolak resin is separate from a sensitizer, the thickness of the resist film 41 differs largely between on the insulating film 22 (the vicinity of the gap adjacent to the lower portion of the step) and on the insulating film 23 (on the step), as can be seen from FIGS. 2 B and 2 C, because it is poor in the thickness traceability. Specifically, when the conventional resist composition is used, the overhanging phenomenon—wherein the plated film goes over the plating frame on the insulating film 23)—is unavoidable because the thickness of resist film 41 on the insulating film 23 is merely at most about 5% of that in the vicinity of the gap.

Then, the resist film is patterned to form a plating frame corresponding to the shape of the upper magnetic pole. At the patterning step, the resist film is exposed to light through a mask pattern, and then subjected to post-exposure baking, development and rinsing, and post-development baking for drying if required, as is the case with the patterning of a resist film comprising an ordinary positive resist. For exposure, ultraviolet rays, laser light such as excimer laser, X-rays, electron beams and so on are all available. However, it is generally preferable to use i-line light (of 365 nm wavelength), g-line light (of 436 nm wavelength), broadband light with an i-line cut, and broadband light. Preferable exposure varies depending on the type of exposure system and the wavelength profile of exposure light, and so may optionally be determined. Preferably, the post-exposure baking is carried out at 80 to 120° C. for 30 to 300 seconds. The developer used herein, for instance, includes an alkaline aqueous solution such as a 1 to 3% aqueous solution of phosphate ($NanH_3$—$nPO_4$), and an aqueous solution of TMAH (tetramethylammonium hydroxide). Preferably, development occurs at about room temperature (20–25° C.) for about 60 to about 600 seconds. Preferably, rinsing is carried out at about room temperature (20–25° C.) for about 10 to about 180 seconds, using ultrapure water.

Figure 3:
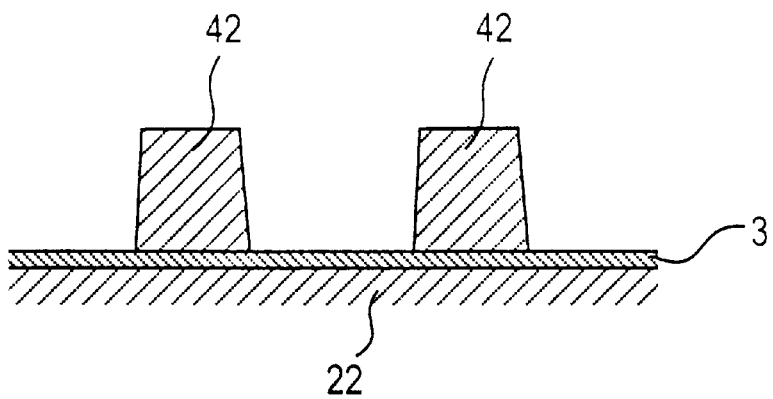
FIGS. 3 A to 3 D are end views illustrative of the steps subsequent to the state shown in FIG. 2 A, all illustrating the ends of insulating films 23 in the vicinity of the gaps adjacent to the lower portions of steps (in a region where the tip portions of magnetic poles are formed) shown in FIG. 2 A.
Figure 3:
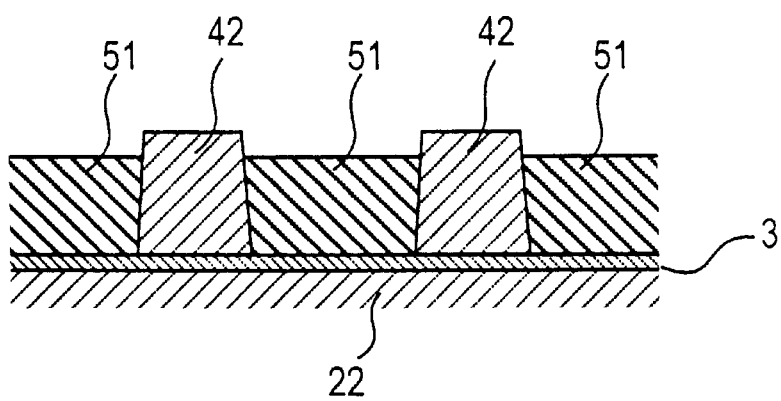
Figure 3:
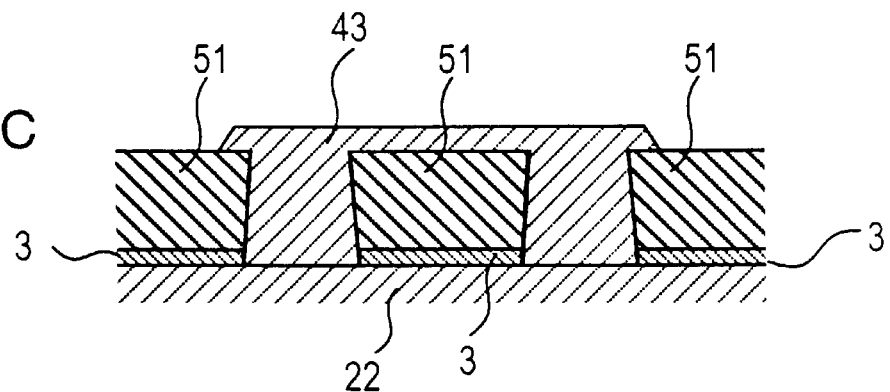
Figure 3:
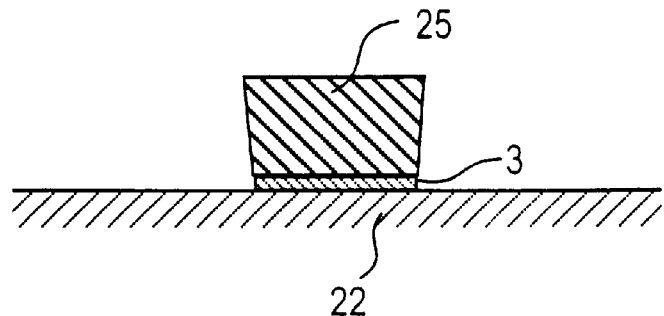

FIG. 3 A is an end schematic of a plating frame 42 formed by the patterning of the resist film. The plating frame 42 is formed on a seed film 3. This end schematic shows the end of the plating frame 42 located in the vicinity of the lower portion of the step formed by the insulating film 23 shown in FIG. 2 A (a region where the tip portion of the magnetic pole is formed), with a cut surface perpendicular to the drawing sheet.

After the plating frame has been formed, electroplating is used to form a magnetic film 51 formed of the material of which the upper magnetic is constructed, as depicted in FIG. 3 B. Then, the plating frame 42 is removed as by a solvent, and the seed film 3 located underneath the plating frame is removed as by chemical etching. Then, a protective resist film 43 is formed over a space where the plating frame was once located and a portion of a magnetic film 51 commensurate with the upper magnetic pole, as depicted in FIG. 3 C. Subsequently, an unnecessary portion of the magnetic film 51 and the seed film 3 located underneath it are removed as by chemical etching, so that a portion of the magnetic film located in a region covered with the protective resist film 43 remains intact. Finally, the protective resist film 43 is removed as by a solvent to obtain a predetermined form of upper magnetic pole 25 as depicted in FIG. 3 D.

It is noted that after the step of FIG. 3 B, the protective resist film may be formed directly on the plating frame without removal of the plating frame 42 and a portion of the seed film 3 located underneath it. In this case, an unnecessary portion of the magnetic film 51 and a portion of the seed film 3 located underneath it are first removed. Then, the plating frame and a portion of the protective resist film located above it are removed, followed by removal of a portion of the seed film located underneath the plating frame.

EXAMPLE

Plating frame samples shown in Table 1 were prepared in the following procedure.

Novolak resins having weight-average molecular weights (Mw) shown in Table 1 were first obtained using m-cresol and p-cresol as phenols and formaldehyde as aldehydes at varying ratios.

Then, a part of hydrogen atoms in the hydroxyl groups of these novolak resins was substituted by 1,2-naphthoquinonediazidosulfonyl groups to obtain substituted novolak resins. For the introduction of the 1,2-naphthoquinonediazidosulfonyl groups, 1,2-naphthoquinonediazido-5-sulfonic acid chloride was used. The degree of esterification of these substituted novolak resins are indicated in Table 1.

Each of these substituted novolak resins was dissolved in ECA to obtain a resist composition.

These resist compositions were used to form plating frames on plane substrates formed of Si. In the first place, each resist composition was coated on the plane substrate by means of spin coating, and prebaked at 90° C. for 90 seconds to form a resist film of 5 µm in thickness thereon. Then, the resist film was exposed to i-line light through a mask pattern. The mask pattern used was an array where a belt form of light transmitting portions of 1 µm in width were alternately arranged with a belt form of light opaque portions of 1 µm in width. After exposure, the resist film was subjected to post-exposure baking at 110° C. for 90 seconds, development, rinsing, and post-development baking. The developer used was a 2.38% aqueous solution of TMAH. Through the steps mentioned above, there was obtained a plating frame sample where a multiplicity of groove-like spaces, each terminating at the surface of the substrate, were arranged parallel with one another.

A scanning electron microscope was used to make estimation of the sectional shape of the spaces in each sample and measure the opening and bottom widths of each space.

Each sample was heated at 130° C. for 30 minutes to make estimation of its heat resistance by observing the sectional shape of spaces in each sample upon heated. The plating frame is required to have some heat resistance because it is often heat treated at about 130° C. prior to plating so as to improve its adhesion to the undercoat. When the plating frame is of low heat resistance, it is impossible to obtain the desired form of magnetic pole because it is deformed upon such heat treatment.

These results are set out in Table 1.

As in the case of each of the aforesaid samples, plating frames were prepared with the exception that a step of 12 $\mu$m in height was provided on a substrate. It was found that the sample according to the present invention is excellent in the thickness traceability as can be seen from a height of about 2.8 $\mu$m on the step and a height of about 6.0 $\mu$m in the vicinity of the gap adjacent to the step.

Using the resist composition for sample No. 3 shown in Table 1, a thin film magnetic head was prepared. The plating frame corresponding to the tip portion of the upper magnetic pole was 6 $\mu$m in height, a space width was 1.8 $\mu$m, and a portion of the plating film corresponding to that tip portion was 4 $\mu$m in thickness. As a result, the upper magnetic pole in the thin film magnetic head had a length of about 3.5 $\mu$m. A section of the tip portion of the upper magnetic pole in the thin film magnetic head took a rectangular shape conforming to the sectional shape of the spaces in the plating frame. In a thin film magnetic head prepared in the same manner as mentioned above with the exception that the resist composition for sample No. 8 was used, however, a section of the tip portion of the upper magnetic pole took an inverted

TABLE 1

| Sample No. | Mw | Degree of esterification (%) | Section of space Shape | Opening width $\mu$m | Bottom width $\mu$m | Heat resistance |
|---|---|---|---|---|---|---|
| 1 (Comp.) | 1000* | 17 | necking | 1.20 | 1.10 | poor |
| 2 | 2000 | 17 | good | 1.05 | 1.00 | Slightly good |
| 3 | 4000 | 17 | good | 1.05 | 1.00 | good |
| 4 | 5000 | 17 | good | 1.10 | 1.00 | good |
| 5 | 6000 | 17 | slight tailling | 1.35 | 1.10 | good |
| 6 (Comp.) | 8000* | 17 | tailling | 1.55 | 1.10 | good |
| 7 (Comp.) | 10000* | 17 | tailling | 1.60 | 0.80 | good |
| 8 (Comp.) | 4500 | 10* | tailling | 1.50 | 1.10 | good |
| 9 | 4500 | 12 | slight tailling | 1.30 | 1.05 | good |
| 10 | 4500 | 16 | good | 1.05 | 1.00 | good |
| 11 | 4500 | 18 | good | 1.05 | 1.00 | good |
| 12 | 4500 | 22 | slight necking | 1.20 | 1.15 | good |
| 13 (Comp.) | 4500 | 25* | necking | 1.30 | 1.20 | good |

*indicates departures from the range defined herein.
Mw represents weight-average molecular weight when calculated as polystyrene.

Figure 4:
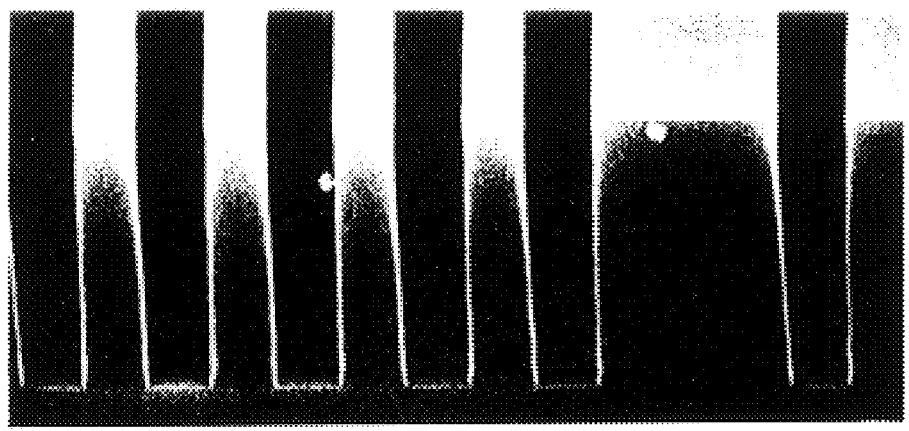
FIG. 4 is a substitute photograph for a drawing showing a fine pattern formed on a substrate. That is.

The results shown in Table 1 clarify the advantages of the present invention over the prior art. That is, when the resist compositions with their molecular weight Mw and degree of substitution lying within the ranges defined herein are used, there are obtained spaces that are substantially free from shape defects with their opening width substantially equal to their bottom width. There is also obtained good heat resistance. However, when resist compositions with their molecular weight Mw and degree of substitution deviating from the ranges defined herein are used, it is likely that spaces having shape defects such as tailling or necking in section are obtained with their opening width differing largely from their bottom width. Scanning electron microphotographs of sample No. 3 according to the present invention, sample No. 8 having a tailling defect and sample No. 13 having a necking defect are attached hereto in the form of FIGS. 4, 5 and 6, respectively.

Figure 5:
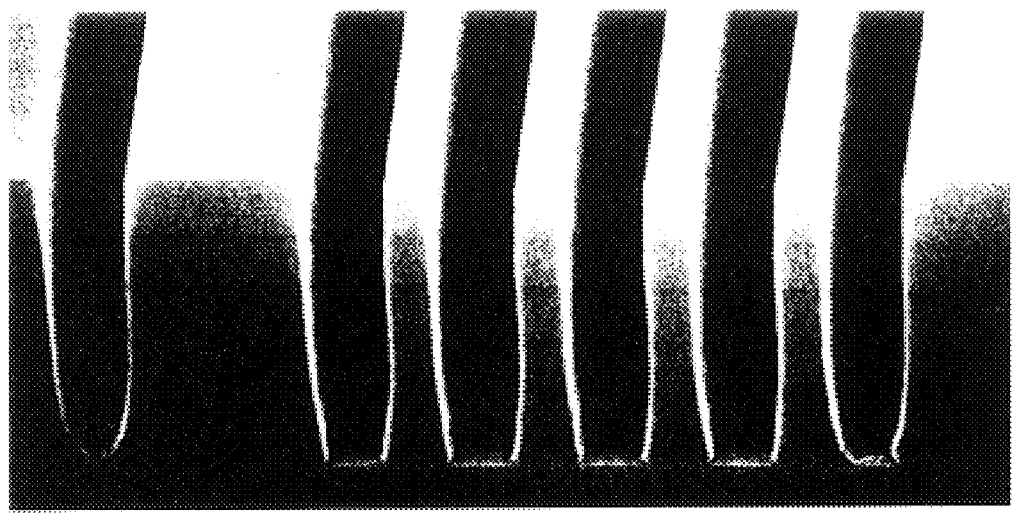
FIG. 5 is a substitute photograph for a drawing showing a fine pattern formed on a substrate. That is.

Using the resist composition for sample No. 4 and a mask pattern comprising 0.8-$\mu$m wide light transmitting portions and 0.8-$\mu$m wide light opaque portions, a plating frame of 5 $\mu$m in height was prepared. A scanning electron microphotograph of this plating frame sample is attached hereto as FIG. 7. Even with this sample, spaces of consistent shape are obtained as in the case of sample No. 3.

trapezoidal shape as in the case of the spaces shown in FIG. 5. A magnetic pole arrangement of such an inverted trapezoidal shape in section with the gap side undermost is poor in write efficiency. In a thin film magnetic head prepared in the same manner as mentioned above with the exception that the resist composition for sample No. 13 was used, sections of the tip portion of the upper magnetic pole were inconsistent in shape. Sectional shapes of the spaces in the plating frame used to form the upper magnetic pole in this magnetic head had necking defects as can be seen from FIG. 6. Such necking defects were found to be made up of fine asperities which hardly received a plating film with the inclusion of air bubbles, etc. This appears to be the leading cause of inconsistent sections of the magnetic pole. Such inconsistent shapes, because of lack of reproducibillity, make it difficult to mass-produce magnetic poles having consistent magnetic properties.

The results of the above examples clarify the advantages of the present invention.

What is claimed is:

1. A method for fabricating a magnetic pole in a thin film magnetic head comprising
   patterning a resist composition to form a plating frame including a space having a section of up to 2 $\mu$m in width and at least 4 $\mu$m in depth, and plating a magnetic film in said plating frame to form said magnetic pole of said thin film magnetic head, wherein said resist composition contains a novolak resin comprising at least one recurring unit represented by

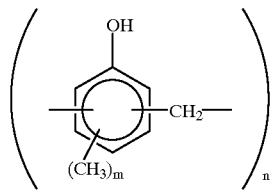

where n is an integer of 1 to 4 and m is an integer of 0 to 3;

0.12 to 0.22 mol % of hydroxyl hydrogen in said recurring unit is substituted with a 1,2-naphthoquinonediazidosulfonyl group; and said novolak resin has a weight average molecular weight of 2,000 to 6,000 calculated as polystyrene.

2. The method of claim 1, wherein said space has a sectional depth of up to 10 $\mu$m.

3. The method of claim 1, wherein said section is up to 1.5 $\mu$m in width.

4. The method of claim 1, wherein said section has a depth to width ratio of at least 2.

5. The method of claim 1, wherein said magnetic film comprises a soft magnetic material.

6. The method of claim 5, wherein the said soft magnetic material is selected from a group consisting of NiFe, CoFe and CoFeNi.

7. The method of claim 1, wherein said magnetic film is plated from a seed film.

8. The method of claim 7, wherein said seed film comprises a material selected from a group consisting of NiFe, CoFe and CoFeNi.

9. The method of claim 1, wherein 0.16 to 0.18 mol % of hydroxyl hydrogen in said recurring unit is substituted with a 1,2-naphthoquinonediazidosulfonyl group.

10. The method of claim 1, wherein said novolak resin has a weight average molecular weight of from 4,000 to 5,000.

* * * * *